United States Patent [19]

Tanaka

[11] 4,144,498
[45] Mar. 13, 1979

[54] TELEVISION TUNING METHOD AND APPARATUS FOR TUNING EMPLOYING SLOPE FACTOR DERIVATION

[75] Inventor: Akio Tanaka, Chicago, Ill.

[73] Assignee: Zenith Radio Corporation, Glenview, Ill.

[21] Appl. No.: 815,893

[22] Filed: Jul. 15, 1977

[51] Int. Cl.² .............................................. H04B 1/26
[52] U.S. Cl. ........................ 325/464; 334/15; 358/191
[58] Field of Search ............................... 325/420–422, 325/453, 459, 464, 468; 334/11, 14, 15; 358/191

[56] References Cited

U.S. PATENT DOCUMENTS 3,715,687  2/1973  Solender ............................... 331/179

Primary Examiner—Robert L. Griffin
Assistant Examiner—Marc E. Bookbinder
Attorney, Agent, or Firm—Nicholas A. Camasto

[57] ABSTRACT

A tuning system for a television receiver includes fine tune memories and tuning information memories having reference channel nominal tuning information for each frequency band and nominal tuning information for each channel. Accumulator means subtract the nominal tuning information for a selected channel from the nominal tuning information for an adjacent channel to derive a slope factor for the channel. The slope factor is used to equalize an auxiliary tuning voltage source. Control logic, including channel number counters and latches and state counters, is coupled to the accumulator means, tuning information memories and the fine tune memories. The memories' and accumulator means' outputs are coupled to a corresponding plurality of comparators which are also coupled to counters for deriving pulse-width modulated (PWM) signals corresponding to tuning information in the accumulator means and memories. The PWM signals are supplied to a tuning voltage generator where they are combined to produce the final tuning voltage for the tuner. The final tuning voltage consists of the nominal tuning voltage combined with the product of the fine tune voltage and the derived slope factor.

12 Claims, 9 Drawing Figures

TELEVISION TUNING METHOD AND APPARATUS FOR TUNING EMPLOYING SLOPE FACTOR DERIVATION

CROSS REFERENCE TO RELATED PATENT APPLICATION

This application is related to, but in no way dependent upon the invention and apparatus disclosed in copending application Ser. No. 791,897 filed Apr. 28, 1977 and application Ser. No. 807,627 filed June 17, 1977, both in the name of Akio Tanaka and assigned to Zenith Radio Corporation.

FIELD OF THE INVENTION

This invention relates generally to digital tuning systems and in particular to fully equalized all-electronic television receiver digital tuning systems having a memory for storing tuning information.

BACKGROUND OF THE INVENTION AND PRIOR ART

In varactor tuners, which are often referred to as electronic tuners, varactor diodes exhibit capacitance variations with changes in bias voltage and serve as the variable reactances in-otherwise-conventional tuned circuits. Such tuning systems are easy to tune, free from RF signal carrying contacts and afford the designer great versatility in receiver styling. As pointed out in the related applications above, their most serious drawbacks are the limited range of diode capacitance change and the nonlinear relationship between frequency and bias voltage. The Federal Communications Commission so-called "equal tuning" rule for VHF and UHF television channels added difficulty to an already formidable problem.

The invention in the first-mentioned related application provides an attractive solution to these problems. In brief, that system produces a separate "slope factor" which is related to the slope of the tuning voltage-versus-frequency characteristic for proportioning the "fine" tuning voltage such that equal frequency excursions are experienced for equal tuning information increments. The result is a truly "equalized" tuning system. In the environment of the above invention the slope factors are stored in appropriate memories as are the nominal (coarse) tuning informations and fine tuning informations. The memories are channel number addressed. For each channel selection a nominal tuning voltage information, a fine tuning voltage information and a slope factor are produced. The fine tuning information is multiplied by the slope factor and combined with the nominal tuning information for conversion to the final tuning voltage.

The second-mentioned referent application is particularly concerned with memory utilization in digital tuning systems and the savings in memory which may be achieved by use of the slope factor. With the exception of four discontinuities between the low VHF (channels 2-4), mid VHF (5, 6), high VHF (7-13) and UHF (14-83), adjacent channel numbers represent 6MHz increments in frequency. Memory saving is based upon storing reference or initial value tuning information for a reference or pseudo channel in each frequency band and separate tuning increment information, representing the tuning voltage changes required to successively tune from one channel to the next, beginning with the reference or pseudo channel. These increments are the difference equation analog of the slope factors. Upon channel changes, an arithmetic computation is performed in which the initial value information and successive increment informations are added. The initial value tuning information is selected at a point 6MHz below the lowest numbered channel in the band which point is then referred to as the pseudo channel number. Thus, in the low VHF band, for instance, rather than storing complete information words corresponding to the nominal tuning information for channels 2-4, the nominal tuning information for pseudo channel 1 is stored along with the slope factors or increments required to go from pseudo channel 1 to real channel 2, from channel 2 to channel 3, and from channel 3 to channel 4. Suitable logic and apparatus are provided for summing the pseudo channel information and successive increments for obtaining the nominal tuning information corresponding to the selected channel number.

The last increment represents the slope factor of the tuning curve at the selected channel, and is separately available. It is therefore readily usable for equalization of any auxiliary tuning voltage source to provide true equalized tuning for the system.

The present invention uses almost identical structure as that of the second referent application, but does not derive the nominal tuning voltage from a reference channel nominal tuning information and individual tuning increment information. Rather the tuning information increment or slope factor is derived (for equalization purposes) from the stored nominal tuning information for each channel. Reference channel tuning information is required for deriving the slope factor for an end channel in the band.

The present system is extremely attractive in that the slope factors are readily obtainable without resort to any special equipment. As discussed in the other applications, either a zero or fixed offset fine tuning system may be used. In the fixed offset system of the preferred embodiment, the nominal tuning information is selected to be ½ the equalized fine tuning range information below the tuning curve.

The art teaches memory storage of channel tuning information at addressable locations as exemplified by U.S. Pat. No. 3,990,027. There is no known art, other than that represented by the referent copending applications of the invention, relative to slope factor derivation.

OBJECTS OF THE INVENTION

The principal object of this invention is to provide a novel television tuning system.

Another object of this invention is to provide a novel equalized tuning television system.

SUMMARY OF THE INVENTION

In accordance with the inventive method and apparatus a television receiver includes a voltage controlled tuner having a nonlinear tuning voltage-versus-frequency characteristic, tuning voltage means for generating a tuning voltage for the tuner and memory means storing nominal tuning information for all channels. The slope factor for any channel is derived from the nominal tuning information. The slope information is used to equalize any auxiliary tuning information.

BRIEF DESCRIPTION OF THE DRAWINGS

The invention and its objects will best be understood by reference to the detailed description of the preferred embodiment thereof in conjunction with the drawings in which.

IC DETAILS

All IC's are available from Texas Instruments Corporation of Dallas, Texas.

The schematic diagrams have been simplified to aid in describing the invention. All integrated circuits used are "off-the-shelf" items obtainable under the given designations from the identified source. Only terminals that change logic states are shown. All $V_{CC}$ terminals are connected to 5 volts D.C. and all ground terminals are connected to 0 volts. Unused outputs are left open. Device pin numbers have not been used since they are nondescriptive and difficult to follow. Some terminal designations are abbreviated; in the memories, any $A_0$–$A_7$ terminals are referred to as $A_A$–$A_H$ for consistency.

Input terminals that do not change logic states are connected as follows:

| Device | Ref. # | Description | Inputs to 0v. | Inputs to 5v. |
| --- | --- | --- | --- | --- |
| SN7475 | 302,303 | latch | | |
| SN74190 | 304,305 | counter | $D_A,D_B,D_C$ $D_D$,EG | L |
| SN74393 | 321 | binary counter | | |
| SN74S138 | 323 | decoder | G2A,G2B | G1 |
| SN74S281 | 452–454 | accumulator | M,RC,RS1, RSO | |
| SN74S287 | 412–414 | memory | CS1,CS2 | |
| SN74161 | 422–424 | binary counter | A,B,C,D | EP,ET, CL,L |
| SN7485 | 432–434 462–464 532,533 | comparator | A<B,A>B | A=B |
| TMS2101 | 512,513 | memory | CE1, OE | CE2 |
| SN74191 | 522,523 | binary counter | EG | |

DESCRIPTION OF THE PREFERRED EMBODIMENT

Figure 1:
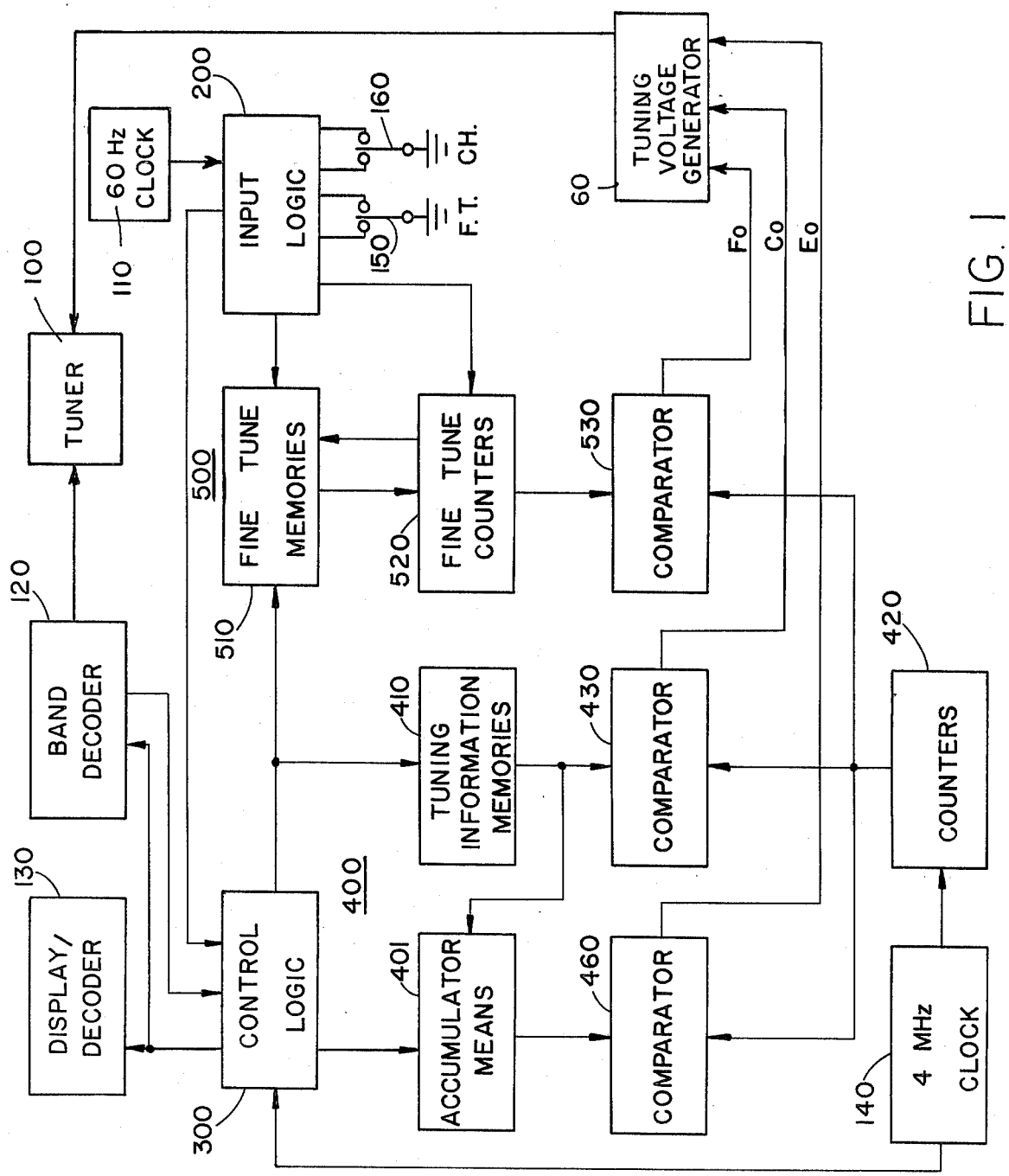
FIG. 1 is a block diagram of a television tuning system constructed in accordance with the invention.

System Block Diagram (FIG. 1)

In FIG. 1, a television tuning system includes a tuner 100, a tuning voltage generator 60, a 60Hz clock 110, a band decoder 120, a display/decoder 130 and a 4MHz clock 140. An input logic circuit 200 is supplied by the 60Hz clock and supplies control logic 300 and the fine tuning section 500, specifically fine tune memories 510 and fine tune counters 520. A fine tuning Up/Dn (up/down) switch 150 and a channel Up/Dn switch 160 are connected to input logic circuit 200. A nominal tuning section 400 includes an accumulator means 401, tuning information memories 410, a pair of comparators 430 and 460 and counters 420.

Control logic 300 supplies display/decoder 130, band decoder 120, accumulator means 401, and tuning memories 510 and 410, the latter being coupled to accumulator means 401 and comparator 430. Band decoder 120 feeds control logic 300 and tuner 100. Accumulator means 401 supplies comparator 460. The other inputs of comparators 430 and 460, and comparator 530 in the fine tuning section, are supplied from counters 420. The information contained in the accumulator means, the tuning information memories and the fine tune counters is read out by the comparators as a plurality of pulse-width modulated (PWM) signals $C_o$, $E_o$ and $F_o$ representing nominal tuning information, equalization information, and fine tuning information, respectively. These informations are supplied to tuning voltage generator 60 from which the tuning voltage for tuner 100 is produced. The 4MHz clock 140 drives control logic 300 and counters 420.

As will be explained in greater detail with reference to the schematic diagrams, tuning information memories 410 include nominal tuning information for each channel and reference or pseudo channel nominal tuning information for each different frequency band. When a channel is selected, the nominal tuning information for that channel and an adjacent channel is supplied to the accumulator means. The pseudo channel information is supplied whenever its adjacent end channel is selected. The incremental tuning information or slope factor for the selected channel is derived by taking the difference between the nominal tuning informations. The slope factor constitutes the equalization information and is made available separately for equalization of secondary tuning voltage sources, such as a source of fine tune information or AFC information. The accumulator means and tuning information memories are interrogated to develop the coarse tuning information $C_o$ and the equalization information $E_o$. Similarly in the fine tune section the $F_o$ signal is produced. The fine tune memories are adjustable via the fine tune switch and fine tune counters with comparators 530 interposed between counters 420 and fine tune counters 520.

Figure 2:
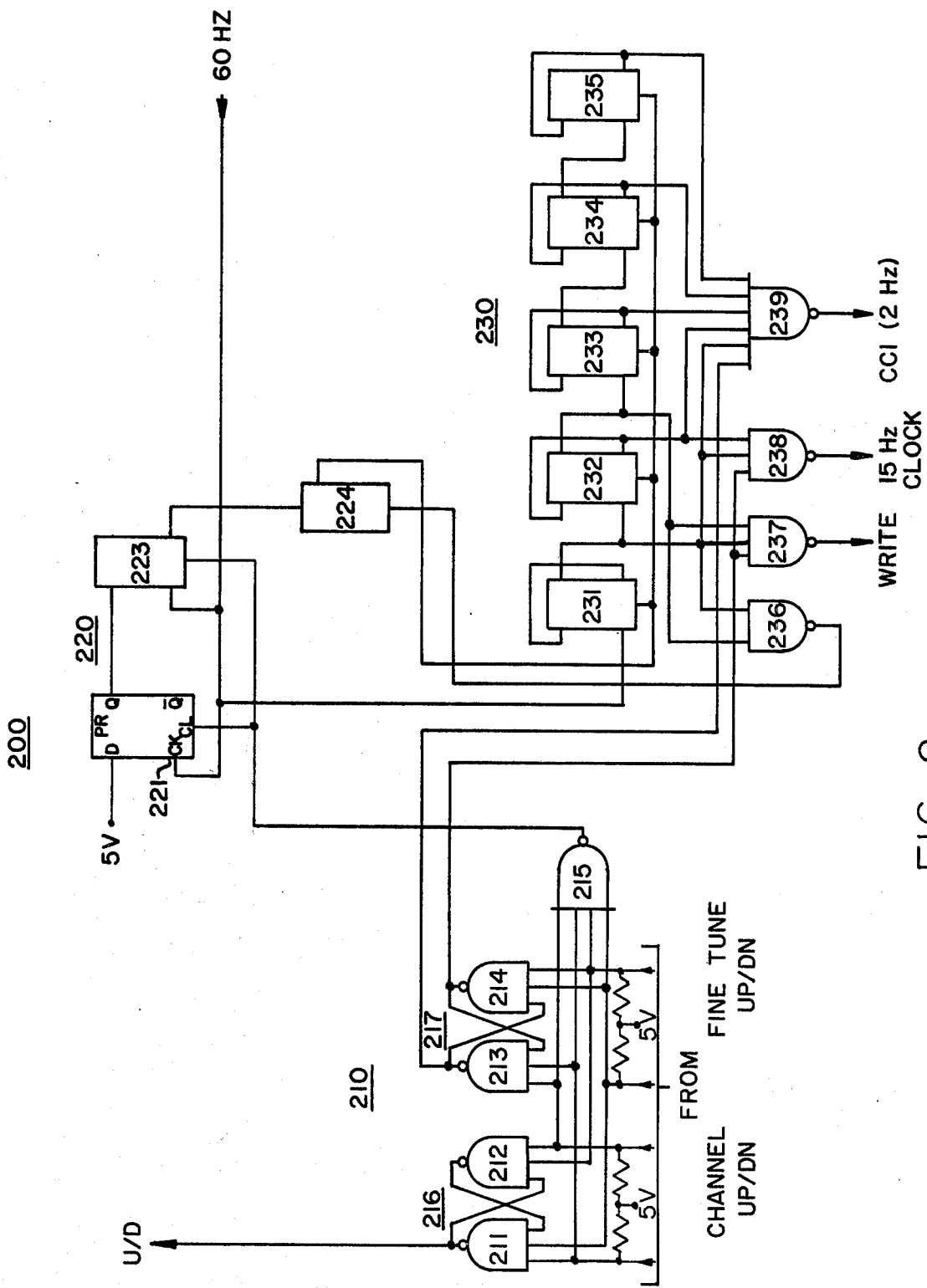
FIG. 2 is a schematic representation of input logic 200.

Input Logic 200 (FIG. 2)

The input logic circuit 200 of FIG. 2 includes an input latch circuit 210 comprising two pairs of cross-coupled NANDS 211–212, and 213–214 and an initiation circuit NAND 215. Each input to the latch circuit is tied to 5V through an appropriate resistor for noise immunity. NANDS 211 and 212 form an RS flip flop 216 for producing and maintaining a U/D (up/down) signal in response to actuation of the channel Up/Dn switch or the fine tune Up/Dn switch. NANDS 213 and 214 comprise an RS flip flop (FF) 217 for enabling the gates controlling the channel change initiate (CCI) pulse of approximately 2Hz and the fine tune write and clock signals of 15Hz. As its name implies, initiation NAND 215 starts the 60Hz countdown counters operating in response to either a channel Up/Dn signal or a fine tune Up/Dn signal.

A "deglitch" circuit 220 comprises a FF 221 and a FF 223 for preventing contact bounce or the like from initiating a channel change or fine tune cycle. FF 224 assures completion of a cycle, once started. Deglitch circuit 220 cooperates with input latch 210 and the 60Hz clock pulses for controlling operation of countdown counter 230, comprising five serially connected FF's 231-235, which develops the low frequency fine tune write, fine tune clock and channel change initiate signals. Three NANDS 237-239 are arranged to decode the different counter states and produce appropriate frequency clocking signals. NAND 236 assures production of the write pulse before allowing counter 230 to terminate operation.

In detail, one pole of the channel Up/Dn switch is coupled to a first input each of NANDS 211, 213 and 215, the other pole being coupled to a first input of NAND 212 and second inputs of NANDS 213 and 215. One pole of the fine tune Up/Dn switch is coupled to a second input of NAND 211, a first input of NAND 214 and a third input of NAND 215. The other pole is coupled to a second input of each of NANDS 212 and 214 and the last input of NAND 215. As mentioned, NANDS 211 and 212 are also cross-coupled (output of each connected to an input of the other) to form RS FF 216. The output of NAND 211 produces the U/D signal. Similarly NANDS 213 and 214 are cross-connected to form RS FF 217. The output of NAND 213 is connected to an input of CCI signal NAND 239 and the output of NAND 214 is coupled to an input each of fine tune NANDS 237 and 238. These RS FF outputs enable the respective connected NANDS.

The output of initiation circuit NAND 215 is coupled to the CL terminals of FF 221 and FF 223. D of FF 221 is connected to 5V; its Q output being connected to D of FF 223. A 60Hz clock signal is connected to the CK terminals of FF's 221 and 223 and also to the CK terminal of FF 231 in counter 230. $\overline{Q}$ of FF 223 is coupled to PR of FF 224, the Q output of which provides a reset signal for FF's 231-235 in counter 230.

The FF's in counter 230 are arranged conventionally with the Q of the first FF 231 coupled to the CK of the second FF 232, and so forth. The $\overline{Q}$ terminals of each flip flop are connected to the D terminals of the same flip flop. Q of 231 is connected to a first input of NAND 236 and second inputs of NANDS 237-239. Q of FF 232 is connected to a second input of NAND 236 and a third input of NAND 237. $\overline{Q}$ of FF 232 is connected to a third input of NAND 238 and 239. The $\overline{Q}$'s of FF's 233-235 are each connected to further input of NAND 239. As mentioned, all of the CL reset terminals for FF's 231-235 are connected to the Q terminal of FF 224. The ouput of NAND 237 supplies the 15Hz fine tune write signal, the output of NAND 238 the 15Hz fine tune clock signal and the output of NAND 239 the approximately 2Hz CCI signal. The output of NAND 236 is connected back to CL of FF 224.

Figure 3:
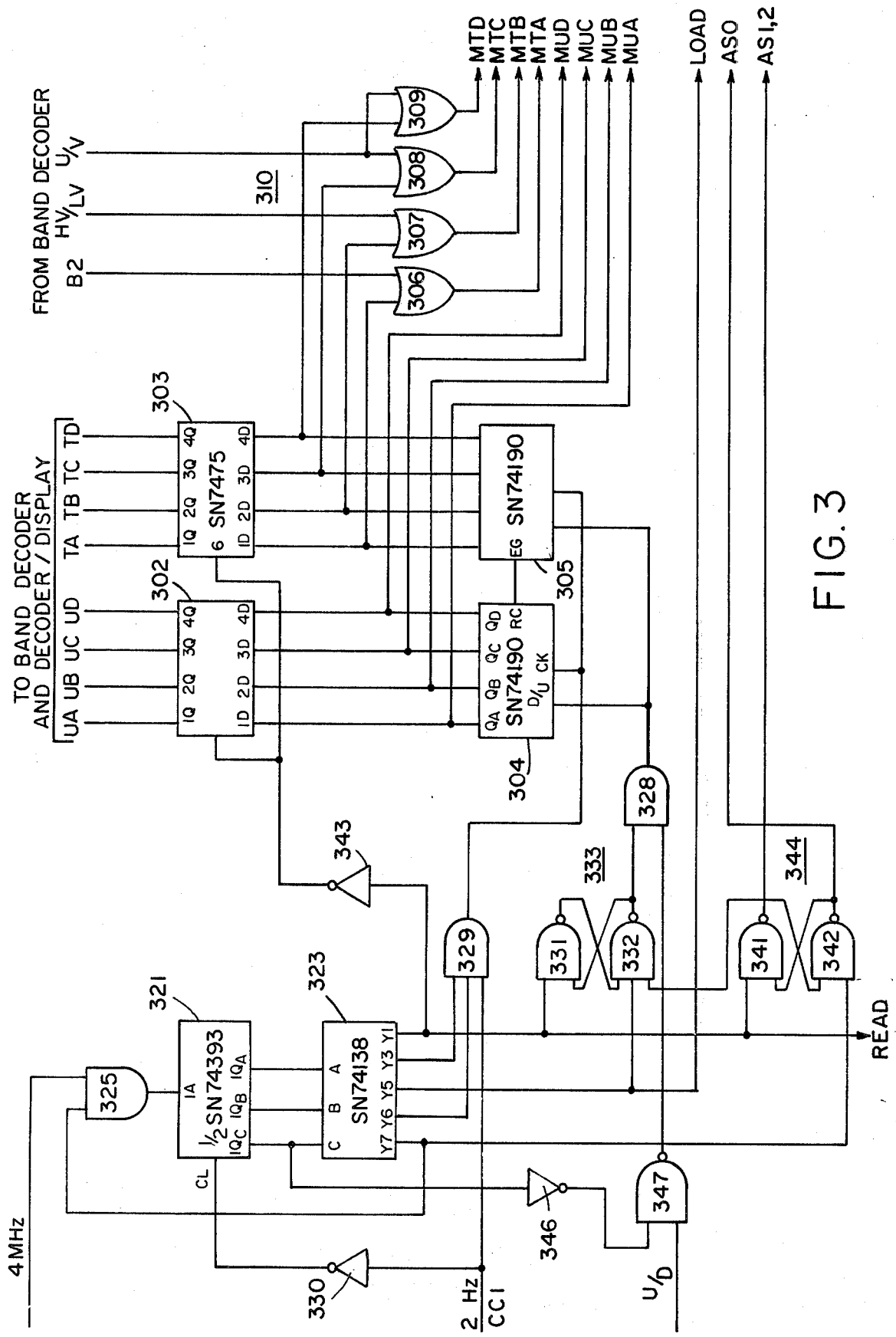
FIG. 3 is a schematic representation of control logic 300.

Control Logic 300 (FIG. 3)

Operation of the channel Up/Dn switch produces a U/D signal for the channel number counters which determines the direction of counting. A channel-change-initiate (CCI) signal is also produced which changes the channel counters by one count and enables an eight-state state counter and decoder arrangement which is clocked at a 4MHz rate. The counter is reset to its first state by the CCI signal. In its second state it fixes the new channel number in the units and tens latches, forces the channel counters in the count up mode and places the accumulator means in its data transfer mode. In state 4 the channel counters are clocked up 1. In state 6 information is transferred from the memory to the accumulator means, in state 7, the channel counters are clocked down by 1 and in state 8 the data in the accumulator means and the memories are subtracted and the state counter is disabled. The output of the accumulator means is the incremental tuning information (slope factor) for the selected channel number in the latches.

In detail, a pair of channel number counters 304, 305 are coupled to a corresponding pair of latches 302-303. The outputs of the latches are connected to decoder/display 130 and band decoder 120 in FIG. 1. Latch 302 presents the binary coded decimal (BCD) units digit (UA-UD) at its 1Q-4Q terminals. Latch 303 presents the BCD tens digits TA-TD at its 1Q-4Q terminals. Units counter 304 has its $Q_A$-$Q_D$ output terminals connected to the 1D-4D input terminals of latch 302 and tens counter 305 has its $Q_A$-$Q_D$ terminals connected to 1D-4D of latch 303. The BCD units digit is conveyed directly to the tuning information memories over leads MUA-MUD. For reasons to be explained under "Memory Organization," the BCD tens digit is supplied over the leads MTA-MTD to respective first inputs of OR gates 306-309 in a memory address translator 310. The other inputs of these OR gates are supplied from the band decoder. The U/V line supplies the second inputs of OR's 308, 309 and is high for VHF, HV/LV is connected to the second input of OR 307 and is high for channels 2-6 and B2 is connected to the second input of OR 306 and is high for channels 5 and 6. The translator outputs go to the tuning information memories over leads labelled MTA-MTD.

The reset (CL) terminal of state counter 321 is supplied with the 2Hz CCI signal through an inverter 330. An AND 325 supplies clock terminal 1A of counter 321. One input of AND 325 is supplied with a 4MHz signal. The other input of AND 325 is coupled to terminal Y7 of state decoder 323.

The $1Q_A$, $1Q_B$ and $1Q_C$ outputs of state counter 321 are coupled respectively to the A, B and C inputs of state decoder 323. $1Q_C$ is also connected, through an inverter 346 to a first input of a NAND 347, the other input of which is supplied with the U/D signal. The output of NAND 347 is supplied to a first input of an AND 328. Y1 of state decoder 323 supplies a fine tune read signal, NANDS 331 and 341 and, through an inverter 343, the G terminals of 302 and 303. The Y3 and Y6 terminals are connected to first and second inputs of an AND 329. The Y5 terminal is connected to an input of a NAND 332 and supplies the LOAD signal. Y7 is further connected to NAND 342. The 2Hz CCI signal is also coupled to the third input of AND 329. AND 329 supplies CK of counters 304, 305. NANDS 331 and 332 are cross-coupled and form an RS FF 333. The last input of NAND 332 is connected to the output of NAND 341. The output of NAND 332 is connected to the second input of AND 328, the output of which supplies the D/U inputs of counters 304, 305. NANDS 341 and 342 are also cross-coupled and form an RS FF 344. The output of NAND 342 carries the AS0 signal and the output of NAND 341 carries the AS1, AS2 signals for the accumulators. As will be explained, the AS0, AS1 and AS2 signals determine the operating mode of the accumulators.

Figure 4:
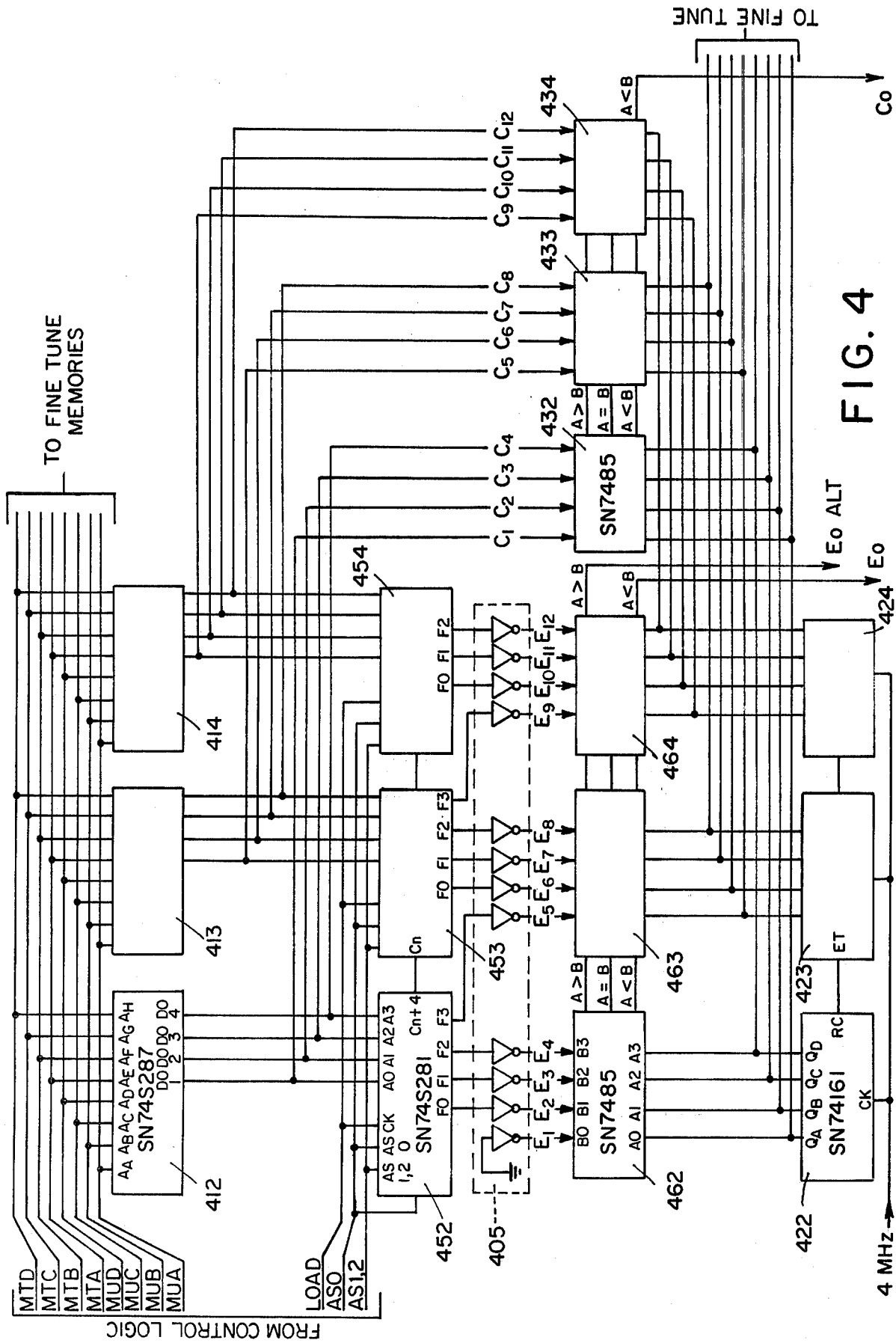
FIG. 4 is a schematic representation of nominal tuning section 400 including accumulator means 401, tuning information memories 410, counters 420 and comparators 430 and 460.

Nominal Tuning Information Section 400 (FIG. 4)

The nominal tuning section contains the accumulators and the tuning information memories as well as the comparators and counters for converting their contents into PWM signals. These memories include nominal tuning information for each channel and reference channel nominal tuning information for each frequency band. The system may be best understood by considering the memory organization at the same time the nominal tuning information computation is discussed.

MEMORY ORGANIZATION

The commercially available memory disclosed can store 256 words and is addressed by 8 lines. Four lines are for the BCD units digit (MUD, MUB, MUC and MUA) and four lines for the BCD tens digit (MTD, MTC, MTB and MTA). The memories are schematically shown for simplicity. Their internal arrangements are well-known in the art. The FCC allocated channel numbers for the television frequency spectrum extend from 2-83. The arrangement enables storage and retrieval of nominal tuning information for each channel and reference channel information for each of the frequency bands with minimal structure. Each four bits defines 16 binary states which may be labelled (using hexadecimal notation) ad 0, 1, 2, ... 9, A, B, C, D, E, F. Each memory location thus has an "x" (tens) and a "y" (units) coordinate, each of which ranges from 0–F. The address of memory location 1 is 00, whereas the address of location 256 is FF.

The BCD units digit from the channel number counters is supplied directly to the corresponding units inputs in the memories. The BCD tens digit is routed through the four OR gates in the memory address translator, the other inputs of which are supplied from the band decoder. For VHF channels the band decoder forces certain of the OR gate outputs to access displaced memory locations. For UHF, the BCD tens digit is directly supplied to the tuning information memories.

There are two basic approaches to operation of the system. For simplicity they will be referred to as Case 1 and Case 2. In Case 1, the pseudo channel information is selected at a point on the tuning curve 6MHz below the lowest numbered channel in the band, and the slope factor for a selected channel is derived by subtracting the information for the adjacent lower channel from that for the selected channel. In Case 2, the pseudo channel information selected at a point 6MHz above the highest numbered channel in a band and the slope factor is the difference in tuning information between the selected channel and the next higher channel. Thus, while the slope factor is not equal to the true slope of the tuning curve at the channel number, it is a very close approximation and yields substantially true equalization over the tuning characteristic. The basic philosophy in each Case is identical and only minor changes in structure are required. For completeness, both Case 1 and Case 2 will be described. Case 1 corresponds to the preferred embodiment.

CASE 1

For the UHF band (channels 14–83) the pseudo channel 13 nominal tuning information is stored in memory location 14 and the nominal tuning informations for channels 14–83 are stored in memory locations 15–84, respectively.

In the VHF low band (channels 2–4), the pseudo channel 1 nominal tuning information is stored in memory location E2 and the nominal tuning informations for channels 2, 3 and 4 are stored in memory locations E3, E4 and E5, respectively. In the VHF mid band (channels 5, 6) the pseudo channel 4 nominal tuning information is stored in memory location F5 and the nominal tuning informations for channels 5 and 6 are stored in memory location F6 and F7, respectively. In the VHF high band (channels 7–13) the pseudo channel 6 nominal tuning information is stored in memory location C7 and the nominal tuning informations for channels 7, 8, 9, 10, 11, 12 and 13 are stored in memory locations C8, C9, D0, D1, D2, D3 and D4, respectively. All other memory locations are programmed with zero.

The pseudo channel tuning information is determined from the tuning curve for each band for a point 6MHz below the lowest numbered channel so that when the nominal tuning information of the pseudo channel is subtracted from the nominal tuning information of the lowest numbered channel, the slope factor for that channel is produced.

Either a "zero offset" fine tuning system, in which the nominal tuning voltage is selected to lie on the tuning voltage curve, or a $\pm \frac{1}{2}$ fine tune voltage range offset may be employed. In the former, a $\pm$ fine tune voltage is used to vary tuning about the nominal tuning point. In an "offset" system, the nominal tuning voltage is selected to be $\frac{1}{2}$ the fine tuning voltage range above or below the tuning curve. The fine tuning voltage source thus contributes $\frac{1}{2}$ of its value to the final tuning voltage.

Case 1 incorporates an offset of $\frac{1}{2}$ the equalized fine tune voltage range below the tuning curve. Thus the final tuning voltage for channel 10, for example, will be based upon the nominal tuning information for channel 9 plus the equalized fine tune information for channel 10. One-half the equalized fine tune range information corresponds to the tuning information increment between channels 9 and 10 (slope factor for channel 10). A conventional $\pm$ AFC arrangement may be readily employed with the AFC voltage being suitably adjusted for level and multiplied by the slope factor before combination with the nominal and equalized fine tune information voltage.

It will be recognized that the actual magnitude of the fine tune information (and AFC information if used) is the product of the slope factor and the content of the fine tune memories. Under idealized tuning conditions, no fine tune correction will be required and the contribution to the final tuning voltage will be exactly $\frac{1}{2}$ the equalized fine tune range information. In practice, the fine tune contribution will vary with tuning conditions and viewer preferences.

It will further be noted that, with the disclosed apparatus, the fine tune range is automatically restricted to a $\pm$ 1 channel. This restriction may readily be overcome if desired by introducing appropriate scaling in the tuning voltage generator to change the magnitude of fine tune correction without upsetting the stored informations or by limiting the range of the fine tune counters.

As is made clear in the referent applications, the system operates at an extremely high rate of speed. When the viewer depresses the Up/Dn switch and watches the display for the desired channel number to appear, the system goes through a complete tuning cycle for each count of the channel counters, i.e., for each new channel number.

When a channel change is initiated, the counters are clocked one count so that the new number appears in the channel counters and is stored in the latches. The appropriate memory location is accessed and the channel counters are stepped up one count. The new memory information corresponding to the next higher channel is entered into the accumulator means, displacing any information stored previously. The counter is then stepped back one count (return to original new number) and the memory information corresponding to that channel number is subtracted from the information in the accumulator means to yield the slope factor.

Thus for channel 2, the memory location initially accessed is E2, at which pseudo channel 1 tuning information is stored. The counter is stepped one count to access memory location E3, at which nominal tuning information corresponding to the tuning curve at channel 2 is stored. The information is subtracted in the accumulator means, yielding the incremental tuning information required to tune from pseudo channel 1 to real channel 2. The slope factor is used to equalize the fine tune information from the fine tune memory and the equalized information is added to the nominal tuning information from memory location E2, from which the final tuning voltage for the tuner is developed. For channel 5, memory location F5 is initially accessed. (Location F5 contains tuning information based on the tuning curve at the pseudo channel 4 position.) As the channel counters are stepped to 06, memory position F6 is interrogated. This location has tuning information corresponding to the tuning curve at channel 5. The informations are subtracted, yielding the slope factor for channel 5. The fine tune information is multiplied by this slope factor and the product is added to the nominal tuning information from memory location F5 to derive the final tuning voltage for channel 5.

CASE 2

In Case 2, the pseudo channel tuning information is selected at a point 6MHz above the highest numbered channel in each band and the slope factor represents the tuning increment between the selected channel and the next highest channel. With an offset fine tune system, the nominal tuning information for the selected channel is determined from the tuning curve for the next higher channel and one-half the equalized fine tune range information is subtracted to produce the final tuning information. Therefore the nominal tuning information in the memory for any given channel will be determined from the tuning curve at the next higher channel.

For channels 2-4, the pseudo channel 5 nominal tuning information is stored in memory location E4 and the nominal tuning informations for channels 2-4 are in memory locations E1-E3, respectively. If channel 4 is selected, the information in memory location E3 is transferred to the accumulator means when the channel counters are decremented one count and is subtracted from the information in memory location E4 when the counters are stepped back one count to the original selected number. This yields the incremental tuning between channel 4 and pseudo channel 5 which is used to equalize the fine tune information. The final tuning voltage is developed from the nominal tuning information in memory location E4 minus the equalized fine tune information.

For channel 6, pseudo channel 7 is used, for channel 13, pseudo channel 14 and for UHF channel 83, pseudo channel 84 is used.

Minor structural changes in implementing Case 2 operation are required. These changes will be summarized in conjunction with the tuning voltage generator discussions.

It will be appreciated that a zero offset fine tune system introduces the need for a fine tune information direction signal to indicate whether the fine tune information is to be added to or subtracted from the nominal tuning information.

It will be further appreciated that the nominal tuning information stored in the memories may be selected for points other than those corresponding to assigned channel numbers. For example, the nominal tuning information for channel 3 may be selected from a point corresponding to channel 2.5 of the tuning curve. The fine tune range can extend from channels 2.5 to 3.5. Therefore when the fine tune counter is in the middle of its range, it will add information to the nominal tuning information for channel 2.5 to yield actual tuning information for channel 3. Such an approach yields a slope factor or increment which more closely approximates the correct slope for the selected channel rather than being the increment to go to the next higher channel (Case 1) or the next lower channel (Case 2).

Three serially connected accumulators 452, 453 and 454 have the load, AS0, AS1 and AS2 signals applied to their CK, AS0, AS1 and AS2 terminals, respectively. AS0 is also connected to Cn of accumulator 452. The accumulator is well-known in the art and includes an arithmetic logic unit (ALU) and a storage register. While the accumulator specified is capable of performing numerous arithmetic and logic functions, only the data transfer and subtraction modes are used in the present invention. The memory outputs are coupled to the inputs of the ALU and the AS0, AS1 and AS2 signals control its operational mode. The ALU output is stored in the register under control of the load signal. The subtraction difference is taken from the output of the ALU. When AS0 is low and AS1 and AS2 are high, the ALU is in its transfer mode and operates to replace the information in the register with the information on the memory output leads upon occurrence of the load signal. When AS0 is high and AS1 and AS2 are low, the ALU is in its subtraction mode and operates to subtract the information on the memory output leads from that already in the register.

Three tuning information memories 412, 413 and 414 have their respective $A_A$-$A_H$ input terminals connected to the MUA-MTD leads from control logic 300. Their D01-D04 output terminals are connected to the A0-A3 input terminals of the respective accumulators. Accumulator 452 has output terminals F0-F2 supplying the $E_2$-$E_4$ signals to the B1-B3 input terminals of a comparator 462. The $E_1$ lead is grounded and F3 supplies $E_5$ to $B_0$ of comparator 463. Comparators 463 and 464 are similarly arranged with respect to accumulators 453 and 454, the $E_6$-$E_8$ signals being supplied to comparator 463 and the $E_9$-$E_{12}$ signals to comparator 464. $E_9$ is supplied from F3 of accumulator 453.

It will be noted that the data outputs of the accumulators are shifted up by one bit. Since the slope factor is the tuning increment between two adjacent channels and represents a tuning range of one channel and it is desired to have a tuning range of two channels, shifting the accumulator data outputs up one bit gives a ± one channel fine tune range.

Three counters 422, 423 and 424 have their $Q_A$-$Q_D$ terminals connected to the A0-A3 inputs of comparators 462, 463 and 464, respectively. The comparators are serially connected and the $E_o$ signal — representing the slope factor or incremental tuning information — is taken from comparator 464.

A plurality of inverters enclosed by dashed line box 405 are shown interposed in the $E_1$-$E_{12}$ signal lines. This modification is required when using the tuning voltage generator of FIG. 7. In that case the $E_o$ alternate signal is also used. For the tuning voltage generator of FIG. 6 the inverters and $E_o$ alternate signal should be ignored.

As fully explained in the referenced copending application, the comparators have a high value output when the count presented by the counter is less than the information in the memory and a low value for all other counts. The $E_o$ signal appears as a PWM signal with a duration representative of the ALU output. Thus the count in the counter is a direct measure of the information at the particular memory location being interrogated.

Comparators 432-434 are arranged to receive the $C_1$-$C_{12}$ signals from tuning information memories 412-414. The other comparator inputs are connected to counters 422-424, respectively and their output is the $C_o$ signal (taken from comparator 434). It too is a PWM signal, the duration of which is directly related to the memory content.

NOMINAL TUNING EXAMPLE

Assume in Case 1 the receiver is tuned to VHF channel number 2 and the viewer decides to change to a different, higher numbered channel. When the receiver is tuned to channel 2, latch 302 contains a BCD "0" and latch 303 a BCD "2." The channel number is presented to the viewer via the display/decoder (with or without the leading "0" being blanked) and the band decoder presents appropriate signals to the OR's in memory translator 310, resulting in memory location E2 being accessed, from whence tuning information is received for the tuner. Upon operation of the channel Up/Dn switch, the U/D signal goes high indicating an upward-direction change in channel number. The high level U/D signal is applied to NAND 347, which places a low level signal on AND 328. AND 328 places a low level signal on the D/U terminals of channel number counters 304-305, conditioning them for counting up.

It was shown from the control logic in FIG. 2 that the 2Hz CCI pulse signal is produced at the output of NAND 239. The inverted pulse is supplied to the reset terminal CL of state counter 321. Prior to the CCI pulse the Y7 output of state decoder 327 is low, inhibiting AND 325. When state counter 321 is reset, Y7 goes high enabling AND 325 to pass the 4MHz clock pulses. The CCI pulse is also applied to AND 329. The trailing edge of this pulse clocks channel counters 304, 305 and the counters count up one count.

The 4MHz clock pulses to state counter 321 are now effective and it cycles to state "2" in which its Y1 output goes low, resulting in transfer of the new channel number 03 into the channel number latches. Y1 in going low, also sets RS FF 333 to force "up" counting of the channel counters by placing a low signal on one input of AND 328. It also sets RS FF 344 to place the accumulators in their data transfer mode. States "3" and "5" of state counter 321 are not used. In state "4," Y3 goes low and through AND 329 clocks the channel number counters to count one count in the up direction previously determined by AND 328. In state "6," Y5 goes low, producing the load signal resulting in the contents of accessed memory location E4 being loaded into the accumulator registers, displacing any previous information in the registers. RS FF 333 is also reset to now place a high level on one input of AND 328. The $1Q_C$ output of state counter 321 is low for states "1"-"4" and high for states "5"-"8." Thus in state "6," $1Q_C$ is high and, through inverter 346, places a low level signal on NAND 347, thus insuring a high output on the other input of AND 328. Therefore the output of AND 328 is forced to be high and the channel counters locked into a down counting mode. In state "7," Y6 goes low and through AND 329, clocks the channel counters which count down one count. In state "8," Y7 goes low, causing RS FF 344 to switch. The AS0 output of RS FF 344 goes high and its AS1, AS2 output goes low which causes the ALU of the accumulator to develop the difference between the memory information in the accessed location E3 and the information in its register. Y7 also disables the state counter by virtue of the low level signal applied to AND 325.

If viewer wants channel 4, the Up/Dn switch is held until the display/decoder indicates channel 4. The viewer may of course tune by watching the TV picture instead of the channel number display. Tuning occurs so rapidly that the 2Hz CCI signal yields more than enough time to tune the receiver for each new channel number produced. Thus when channel number 4 is put in the latch, memory locations E5 and E4 are interrogated.

Figure 5:
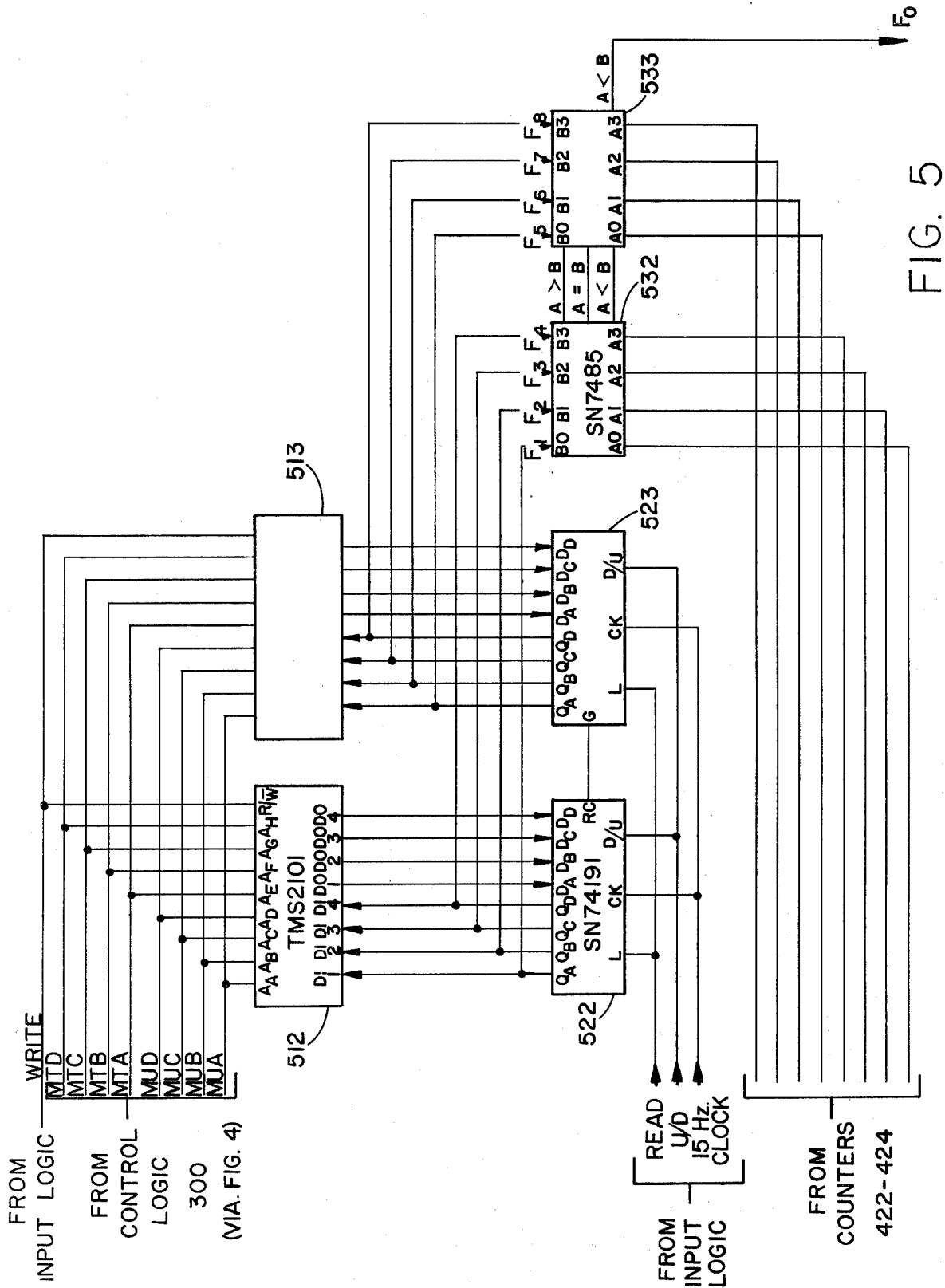
FIG. 5 is a schematic representation of the fine tuning section 500 including fine tune memories 510, fine tune counters 520 and comparator 530.

Fine Tuning System 500 (FIG. 5)

This section is substantially identical to that disclosed in the above-mentioned copending applications.

In this section, additional counters are employed for electrically altering the corresponding fine tune memories' contents in accordance with viewer preferences. The fine tune memories are interrogated each time a read signal is received from the control logic (FIG. 3). The comparators operate in the same manner as the comparators for the tuning information memories. The fine tuning information is automatically updated in the memories by the input logic, responsive to operation of the fine tune Up/Dn switch.

Outputs $Q_A$-$Q_D$ of fine tune counters 522, 523 are connected to input terminals $DI_1$-$DI_4$ of fine tune memories 512, 513 and input terminals B0-B3 of comparators 532, 533. A0-A3 of comparators 532 and 533 are connected to $Q_A$-$Q_D$ of counters 422 and 423 (FIG. 4) respectively. The fine tune write signal is coupled to the R/W terminals of fine tune memories 512 and 513, the U/D signal coupled to the D/U terminals of the fine tune counters 522 and 523 and a 15Hz clock signal coupled to the CK terminals of the counters. These signals are all supplied from input logic 200.

The $Q_A$-$Q_D$ of fine tune counters 522, 523 are connected to corresponding inputs of comparators 532, 533 and bear lead designations $F_1$-$F_4$ for comparator 532 and $F_5$-$F_8$ for comparator 533. Outputs $DO_1$-$DO_4$ of memories 512, 513 are connected to inputs $D_A$-$D_D$ of fine tune counters 522, 523, respectively. As the "C" leads were related to the output signal $C_o$ and the "E" leads to the output signal $E_o$, the "F" leads are related to the output signal $F_o$.

As discussed above for the tuning information memories, the memories are individually and simultaneously addressed by the channel number in the channel number counters 304, 305. During operation of counters 422-423 of FIG. 4, output signal $F_o$ is high when the count is less than the fine tune memory content and low when equal to or greater than the memory content. In practice, the count interval is about 1/16 millisecond for $F_o$ and about one millisecond for $C_o$ and $E_o$. The length of time that the $F_o$, $C_o$ and $E_o$ output signals remain at a high logic level is indicative of the memory or accumulator content. When the comparator determines that the counter output is equal to or greater than the memory (or accumulator) content, its output voltage is low and the duration of the high logic level pulse is directly indicative of the stored information. Thus the $C_o$, $E_o$ and $F_o$ signals at the outputs of each of the comparator groups are PWM signals having duty cycles proportional to the digital information stored in the memories and accumulator.

Tuning Voltage Generator 60 (FIGS. 6–9)

Figure 6:
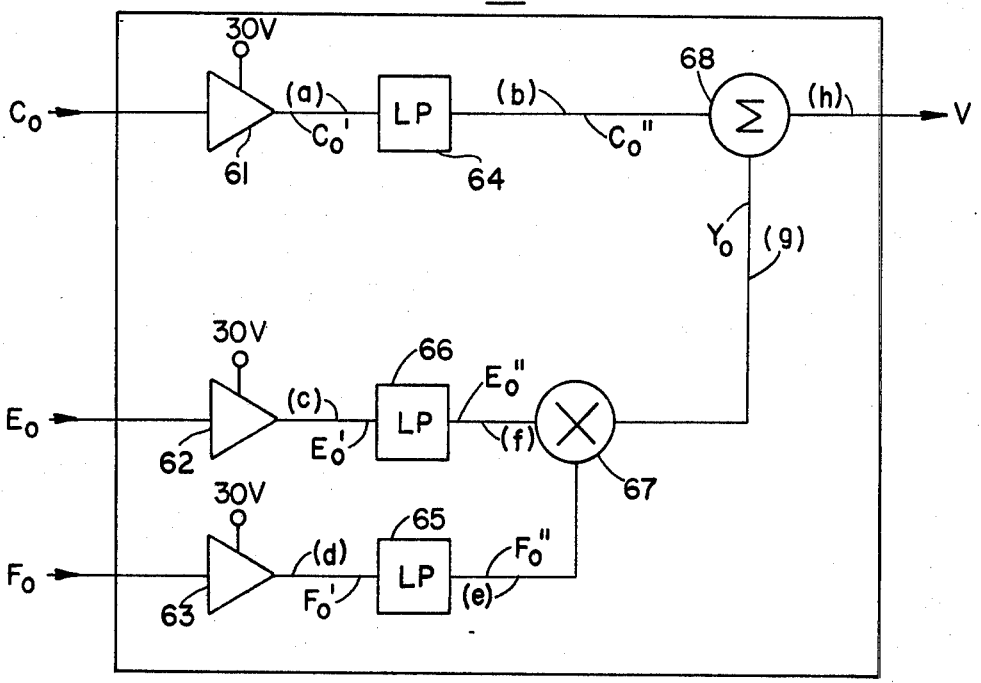
FIG. 6 is a representation of one form of tuning voltage generator 60.

FIG. 6 depicts one implementation of tuning voltage generator 60. The PWM signals $C_o$, $E_o$ and $F_o$ are respectively coupled through a plurality of buffer amplifiers 61, 62 and 63 to produce level shifted PWM signals $C_o'$, $E_o'$ and $F_o'$. Such amplifiers are commonly known in the art and serve to amplify square wave input signals, for example, to the level of the indicated source voltage — in this instance 30 volts. For example, a Texas Instruments type SN7407 device with a "pull-up" resistor to 30 volts may be used. $C_o'$, $F_o'$ and $E_o'$ are supplied to low pass filters 64, 65 and 66 where they are converted into steady state voltages $C_o''$, $F_o''$ and $E_o''$ respectively. $F_o''$ is used as the source for a multiplier 67 to which $E_o''$ is supplied, producing an output signal $Y_o$. $Y_o$ is fed along with $C_o''$ to a summation circuit 68. The final tuning voltage V is produced at the output of operational amplifier summation circuit 68 for application to the tuner. Multiplier 67 is also well-known in the art and may be type MC1594L available from Motorola Inc. It will be appreciated by those skilled in the art that the $F_o''$ signals must be normalized by the source voltage (30v) in multiplier 67 to maintain the proper level for combination with $C_o''$.

Figure 8:
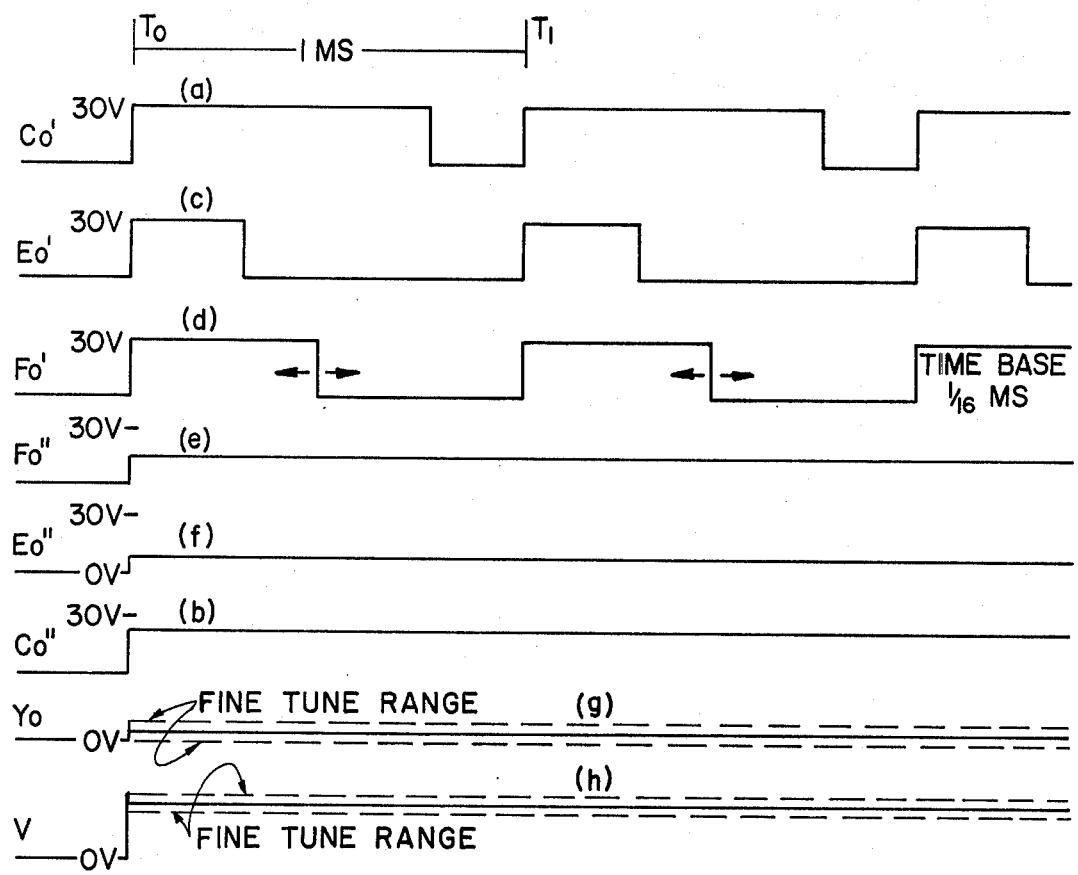
FIG. 8 shows the waveforms associated with the tuning voltage generator of FIG. 6.

Reference to FIG. 8 will help clarify circuit operation. The curves indicated by letters (a) through (h), (and correspondingly marked on the diagram of FIG. 4), indicate the various waveforms of representative signals. $C_o'$ is a pulse of 30 volts amplitude. For the assumed condition, it extends for the major portion of the $T_0$–$T_1$ time cycle (approximately one millisecond in duration). $E_o'$ is a pulse of similar amplitude but (for the assumed condition) of more limited duration. Similarly $F_o'$ has a 30 volt amplitude but a variable duration as indicated by the oppositely-directed horizontal arrows. It should be noted that the time cycle for $F_o'$ is about 1/16 of that shown. For any given channel $C_o'$ and $E_o'$ are fixed quantities corresponding to nominal tuning and slope factor or increment information from accumulator 402–404 and information memories 412–414 respectively, of FIG. 4. The duration of $F_o'$ is determined by the digital information stored in memories 512 and 513 of FIG. 5. The $E_o''$, $F_o''$ and $C_o''$ curves are believed self-explanatory and consist of DC voltages of an amplitude (between 0 and 30 volts) dictated by the duty cycles of the respective $E_o'$, $F_o'$ and $C_o'$ signals. $Y_o$ is $F_o''$ that has been multiplied by $E_o''$ and divided by the source voltage of 30 volts. The $Y_o$ signal has a limited amplitude which represents the permissable fine tuning range. The tuning voltage V is a summation of $Y_o$ and $C_o''$ and is the voltage actually applied to the tuner of the television receiver.

Figure 7:
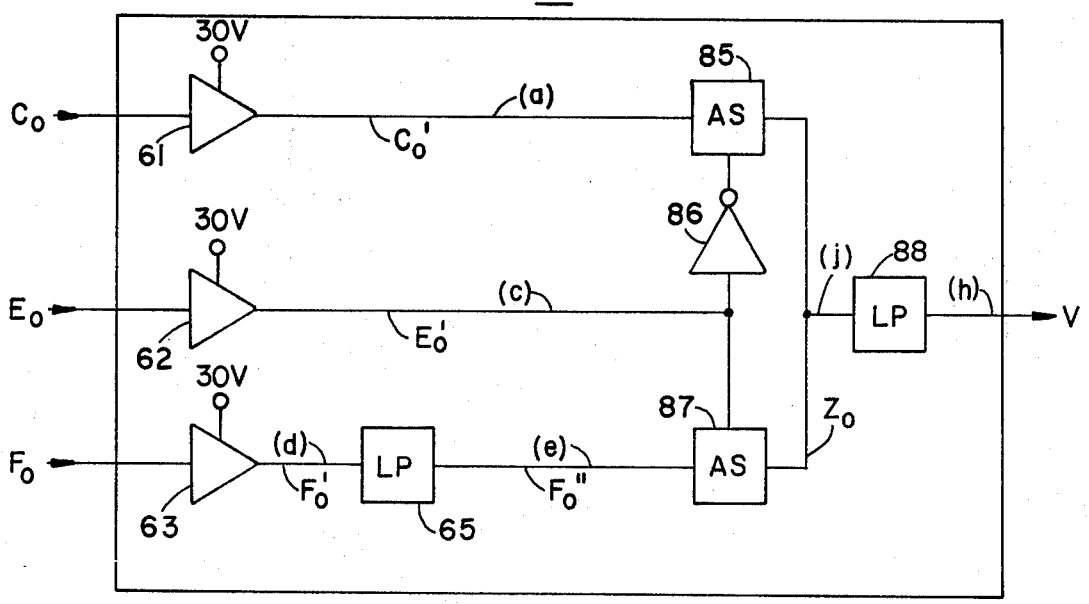
FIG. 7 is a representation of another form of tuning voltage generator 60.

FIG. 7 represents another implementation of tuning voltage generator 60. The $C_o$, $E_o$ and $F_o$ signals are amplified by amplifiers 61, 62 and 63 as described with reference to FIG. 6. The $C_o'$ signal is supplied to a conventional analog switch 85. The $E_o'$ signal is applied through an inverter 86 to analog switch 85. $F_o'$ is supplied to a low pass filter 65 to produce a filtered $F_o''$ signal which is applied to an analog switch 87. $E_o'$ is coupled directly to analog switch 87. The $E_o'$ signal functions as a gate to the analog switches. When it is high (30 volts) it allows $F_o''$ to go through analog switch 87 (and closes analog switch 85) and when low allows $C_o'$ to go through analog switch 85 (and closes analog switch 87) the outputs of analog switches 85 and 87 are combined and applied to a low pass filter 88 which produces the final tuning voltage V shown as waveform (h).

Figure 9:
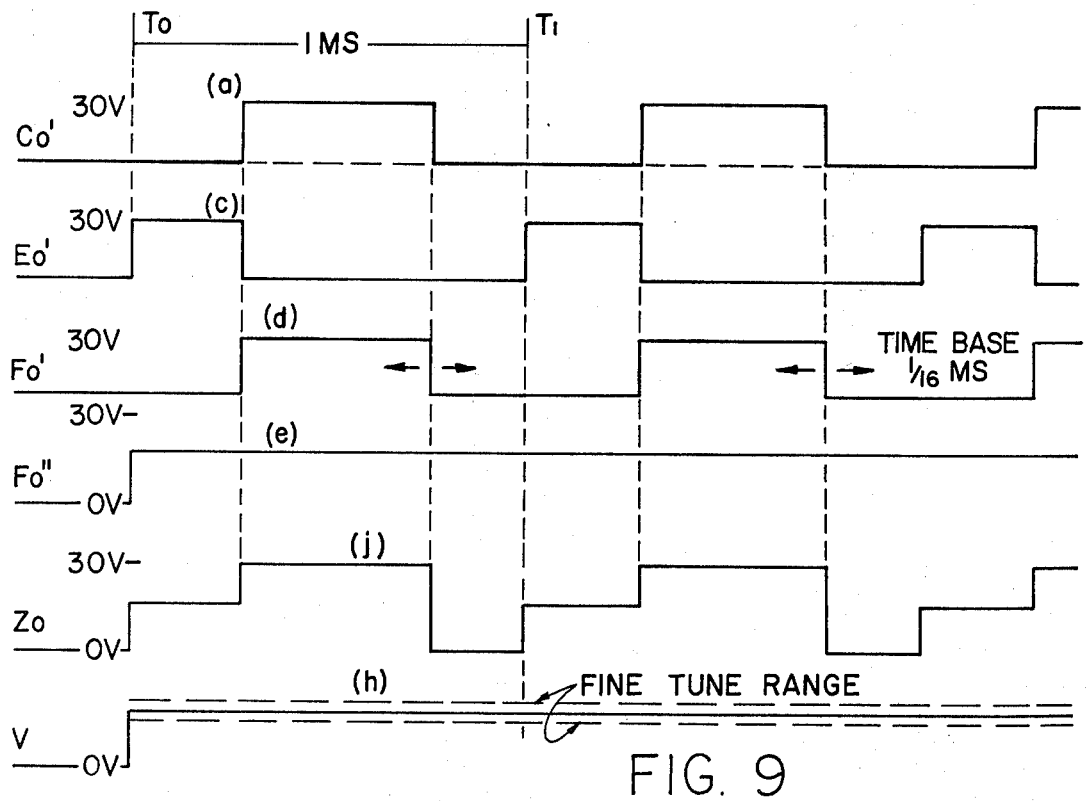
FIG. 9 shows the waveforms associated with the tuning voltage generator of FIG. 7.

The $C_o'$, $E_o'$, $F_o'$ and $F_o''$ waveforms of FIG. 9 are similar to those in FIG. 8. The differences are due to the manner of combining the fine tune voltage to the nominal tuning voltage i.e., analog voltage summation vs. time frame summation. Waveform $Z_o$ represents a combination of $C_o'$ and $F_o''$ and when filtered produces the actual V tuning voltage which is identical to V produced by FIG. 6 implementation.

The illustration of these two tuning voltage generators should show clearly the functional aspects involved. It will be obvious to those skilled in the art that other implementations may readily be used. The particular arrangements are believed well within the scope of the art and are not considered a part of this invention.

The above discussions for all of the Figures refer to Case 1. For Case 2, with the tuning voltage generator of FIG. 6, the $Y_o$ signal is inverted before being coupled to summation circuit 68. With the tuning voltage generator of FIG. 7, the inverter 405 should be ignored and the $E_o$ signal is used. In FIG. 3 AND 328 should be replaced by a NAND gate to provide for "down-up" operation of the channel counters. In FIG. 4, AS0 and AS1 of the accumulator means are connected to 0 volts and 5 volts respectively.

The fine tune counters are assumed to be set at the midpoint of their range. In this condition, they develop one-half of the fine tuning voltage range available. (The magnitude of fine tuning voltage produced will, of course, depend upon the area of the tuning curve.) The nominal tuning voltage is offset from the tuning curve by the equalized contribution of the fine tuning voltage. In a zero offset system, with a ± fine tuning voltage arrangement, the nominal tuning voltage would lie on the curve. In the specification and claims the term "nominal tuning" should be understood to embrace offset systems as well as those having a fine tuning range centered on zero. Similarly it should be obvious that the DC level of an AFC voltage coupled to the system may need to be offset.

What has been described is a novel method of deriving slope factors for equalizing a television tuning system in which nominal tuning information is stored for each channel. The slope channel information for any selected channel is computed from the selected channel nominal tuning information and the adjacent channel nominal tuning information.

What is claimed is:

1. A television tuning system including:
   a voltage controlled tuner having a nonlinear tuning voltage-versus-frequency characteristic;
   memory means storing nominal tuning information for each channel;
   an auxiliary source of tuning information;

means deriving a slope factor for any desired channel from said nominal tuning information by computing the difference in nominal tuning information between different channels;

means proportioning said auxiliary source of tuning information with the derived slope factor; and tuning voltage means generating a tuning voltage for said tuner from said nominal tuning information for said desired channel and the proportioned auxiliary tuning information.

2. A television tuning system as set forth in claim 1 wherein said means deriving a slope factor include;

computing means for interrogating said memory means to yield the nominal tuning information for said desired channel and the nominal tuning information for an adjacent channel and for subtracting the two nominal tuning informations.

3. A television tuning system as set forth in claim 2 further including;

a channel number counter under control of said computing means for accessing said memory means.

4. A television tuning system including:

a voltage controlled tuner having a nonlinear tuning voltage-versus-frequency characteristic;

a channel number accessible memory storing nominal tuning information corresponding to each receivable channel;

an auxiliary source of tuning information;

a channel number generator accessing said memory;

means computing the difference between nominal tuning information corresponding to any selected channel number generated by said channel number generator and that corresponding to an immediately adjacent channel number;

means proportioning said auxiliary tuning information with said difference; and means combining the nominal tuning information for the selected channel with said proportioned auxiliary tuning information for developing the tuning voltage for said tuner.

5. A television tuning system as set forth in claim 4 wherein the computing means comprise a temporary register;

means loading said register with the nominal tuning information corresponding to one of either said selected or said adjacent channel; and means subtracting therefrom the nominal tuning information corresponding to the other of either said selected or adjacent channel.

6. A television tuning system as set forth in claim 5 further including control logic means for controlling said channel number generator for each channel selection to interrogate said memory and read out said nominal tuning information for said selected and said adjacent channels.

7. A television tuning system as set forth in claim 6 wherein said channel number generator includes a counter and said control logic means includes accumulator means incorporating said temporary register and having a data transfer mode and a subtraction mode;

said counter being clocked to an adjacent channel and back under control of said control logic means and said accumulator means developing said difference in nominal tuning information at its output.

8. A television tuning system as set forth in claim 7 wherein said difference is determined by subtraction of the nominal tuning information for said selected channel from the nominal tuning information for its next higher adjacent channel.

9. In a television receiver including a tuner having a nonlinear tuning voltage-versus-frequency characteristic, a memory storing nominal tuning information for all channels and a source of auxiliary tuning information, the method of equalizing the auxiliary tuning information to produce substantially equal tuning effect for equal increments of tuning information throughout the characteristic comprising the steps of:

generating a slope factor for any desired channel from said nominal tuning information by taking the difference between two of said nominal tuning informations;

proportioning the auxiliary tuning information source with the slope factor; and producing the tuner tuning voltage from the nominal tuning information for the desired channel and the proportioned auxiliary tuning information.

10. The method of claim 9 further including the steps of:

accessing the desired channel memory location and an adjacent channel memory location;

reading the nominal tuning information for one of said desired channel and the adjacent channel into a temporary register; and subtracting therefrom the other nominal tuning information.

11. The method of claim 10 further including accumulating means having an arithmetic logic unit and said storage register, and further including a channel number counter and a channel number latch, said method comprising the additional steps of:

latching the desired channel number in the latch;

clocking the channel number counter one count to an adjacent channel number and storing the corresponding nominal tuning information in the register; and clocking the channel number counter back to the desired channel number.

12. The method of claim 11 further including a viewer operated channel Up/Dn switch for controlling the counter and means displaying the channel number in the latch to the viewer, and comprising the steps of:

automatically replacing the number in the latch with the new channel number in the counter at a given repetition rate in response to continued operation of the Up/Dn switch; and repeating the steps of the method for each new channel number.

* * * * *